United States Patent [19]

Yun

[11] Patent Number: 5,757,194

[45] Date of Patent: May 26, 1998

[54] AUTOMATIC BROADBAND ELECTROMAGNETIC GENERATOR

[75] Inventor: Jae-Hoon Yun, Daejeon, Rep. of Korea

[73] Assignee: Electronics and Telecommunications Research Institute, Daejeon, Rep. of Korea

[21] Appl. No.: 558,705

[22] Filed: Nov. 16, 1995

[30] Foreign Application Priority Data

Nov. 16, 1994 [KR] Rep. of Korea ............... 94-30101

[51] Int. Cl.$^6$ ............................... G01R 31/00; H01Q 17/00
[52] U.S. Cl. ........................................ 324/627; 343/703
[58] Field of Search ............................... 324/627–628, 324/261, 95, 501; 343/703

[56] References Cited

U.S. PATENT DOCUMENTS 3,806,943  4/1974  Holloway .................... 343/703
5,285,164  2/1994  Wong ........................ 324/627 X
5,404,098  4/1995  Osburn ...................... 324/627 X
5,430,456  7/1995  Osburn et al. ............... 343/703
5,589,773  12/1996  Berger et al. ............... 324/261

Primary Examiner—Michael Brock
Attorney, Agent, or Firm—Jacobson, Price, Holman & Stern, PLLC

[57] ABSTRACT

An automatic broadband electromagnetic generator is disclosed including a coaxial connector joint portion for maintaining impedance matching; a taper area placed between an object tested and the coaxial connector joint portion, and in which a force transmitting member for rotating an internal conductor is installed to enable external driving; a rotating table for performing bearing variation to the rotation of the object tested; and a terminal portion in which a radio wave absorber terminates high-band electromagnetic waves, a distribution resistor absorbs low-band electromagnetic wave, and a radio wave absorbing ferrite terminates their intermediate band.

10 Claims, 8 Drawing Sheets

AUTOMATIC BROADBAND ELECTROMAGNETIC GENERATOR

BACKGROUND OF THE INVENTION

The present invention relates to an automatic broadband electromagnetic generator (ABEG) used for correcting an electromagnetic field intensity measuring apparatus and antenna or for measuring unnecessary electromagnetic wave interference and tolerance (EMI/EMS) of electric/electronic equipment.

A general TEM cell is low in manufacturing and maintenance costs as compared with an open site or electromagnetic wave semi-anechoic chamber, which is electromagnetic wave trouble/tolerance measurement equipment. In addition, the TEM cell can be installed regardless of external electromagnetic wave environment, and is easy to measure low-frequency band as well as high frequency because it does not use an antenna as its source.

However, when the TEM cell becomes larger, the band of frequency used in measuring electromagnetic wave trouble and tolerance becomes lower because a resonance mode appears in a lower high-frequency band. (A TEM cell of 1.8*1.8*3.6) has a first resonance mode (TEO11) at 67.4 MHz, and a second resonance mode (TEO12) at 83.3 MHz). In order to solve such a problem, a broadband electromagnetic environment simulator (EMES) was proposed.

When an object tested is installed in this apparatus, polarization is fixed. For this reason, in order to measure electromagnetic wave trouble and tolerance, the bearing variation of the object tested must become larger, and many bearing variation numbers for the object tested are required. This decreases reproducibility of measurement and elongates measurement time. Further, this is hard to implement measurement automatization. According to the bearing variation of the object tested, signal lines including power line externally supplied to the object tested are tangled to decrease the accuracy of measurement.

SUMMARY OF THE INVENTION

Therefore, it is an object of the present invention to provide an ABEG having a rotating table for compensating for the lateral bearing variation of an object tested by rotating an internal conductor, and externally supplying force for the bearing variation to the rotation of the object tested, while preventing the leakage of electromagnetic wave, thereby facilitating measurement.

In order to accomplish the object of the present invention, there is provided an automatic broadband electromagnetic generator comprising: a coaxial connector joint portion for maintaining impedance matching; a taper area placed between an object tested and the coaxial connector joint portion, and in which a force transmitting member for rotating an internal conductor is installed to enable external driving; a rotating table for performing bearing variation to the rotation of the object tested; and a terminal portion in which a radio wave absorber terminates high-band electromagnetic wave, a distribution resistor absorbs low-band electromagnetic wave, and a radio wave absorbing ferrite terminates their intermediate band.

In this embodiment, a first driving axis is installed in the taper area to rotate the internal conductor, and a second driving axis is installed in the rotating table outside the ABEG cell to enable measurement to be carried out by hands or a motor, to thereby prevent electromagnetic wave trouble.

In order to interrupt external electromagnetic wave noise, in the rotating table a shielding box having filters of power and signals is provided to rotate first and second driving axes in measurement of electromagnetic wave trouble and tolerance, to thereby automatize measurement.

BRIEF DESCRIPTION OF THE ATTACHED DRAWINGS

DETAILED DESCRIPTION OF THE INVENTION

Hereinafter, a preferred embodiment of the present invention will be described with reference to the attached drawings. Unlike the conventional ABEG in which the bearing variation between an internal electromagnetic field and an object tested, which is inevitably necessary in measurement of electromagnetic wave trouble and tolerance, is performed by directly rotating only the object tested, in the ABEG of the present invention, the lateral bearing variation which may cause physical deformations and is hard to automatize is performed by directly rotating the internal conductor.

Figure 1:
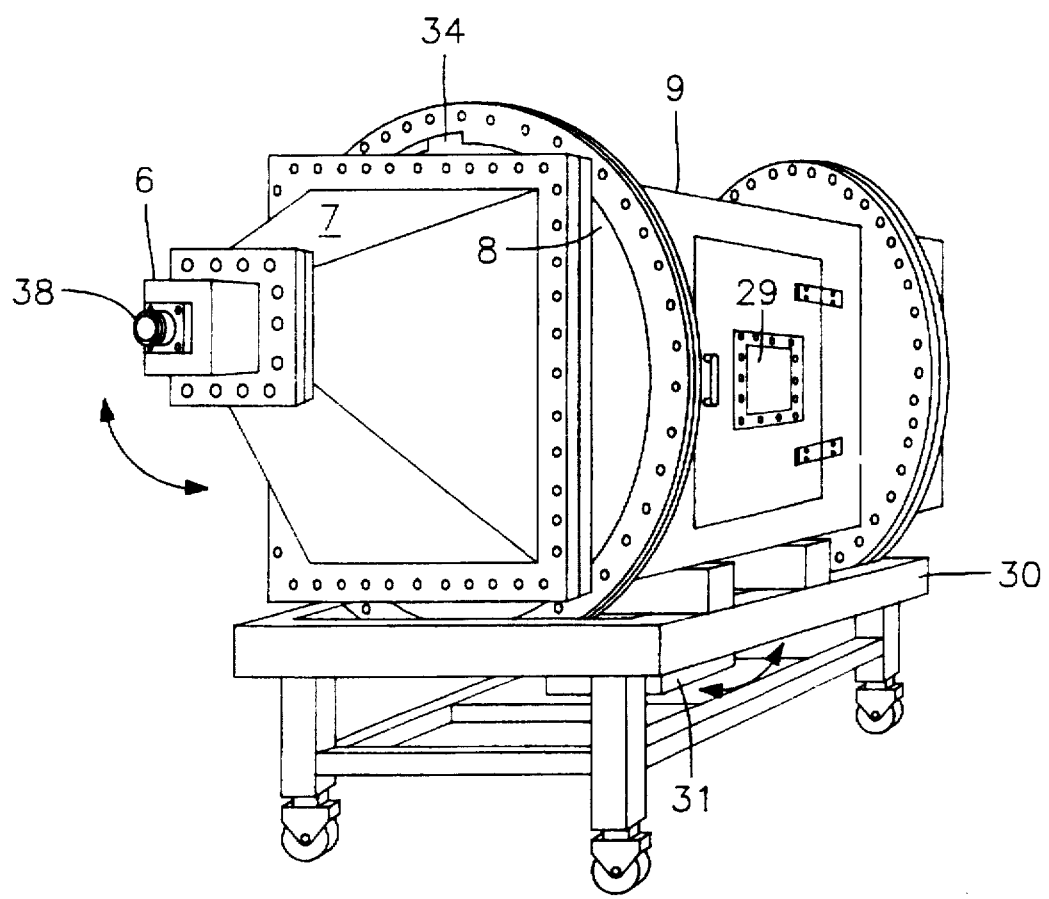
FIG. 1 is a schematic perspective view of an automatic broadband electromagnetic generator (ABEG) of the present invention.
Figure 2A:
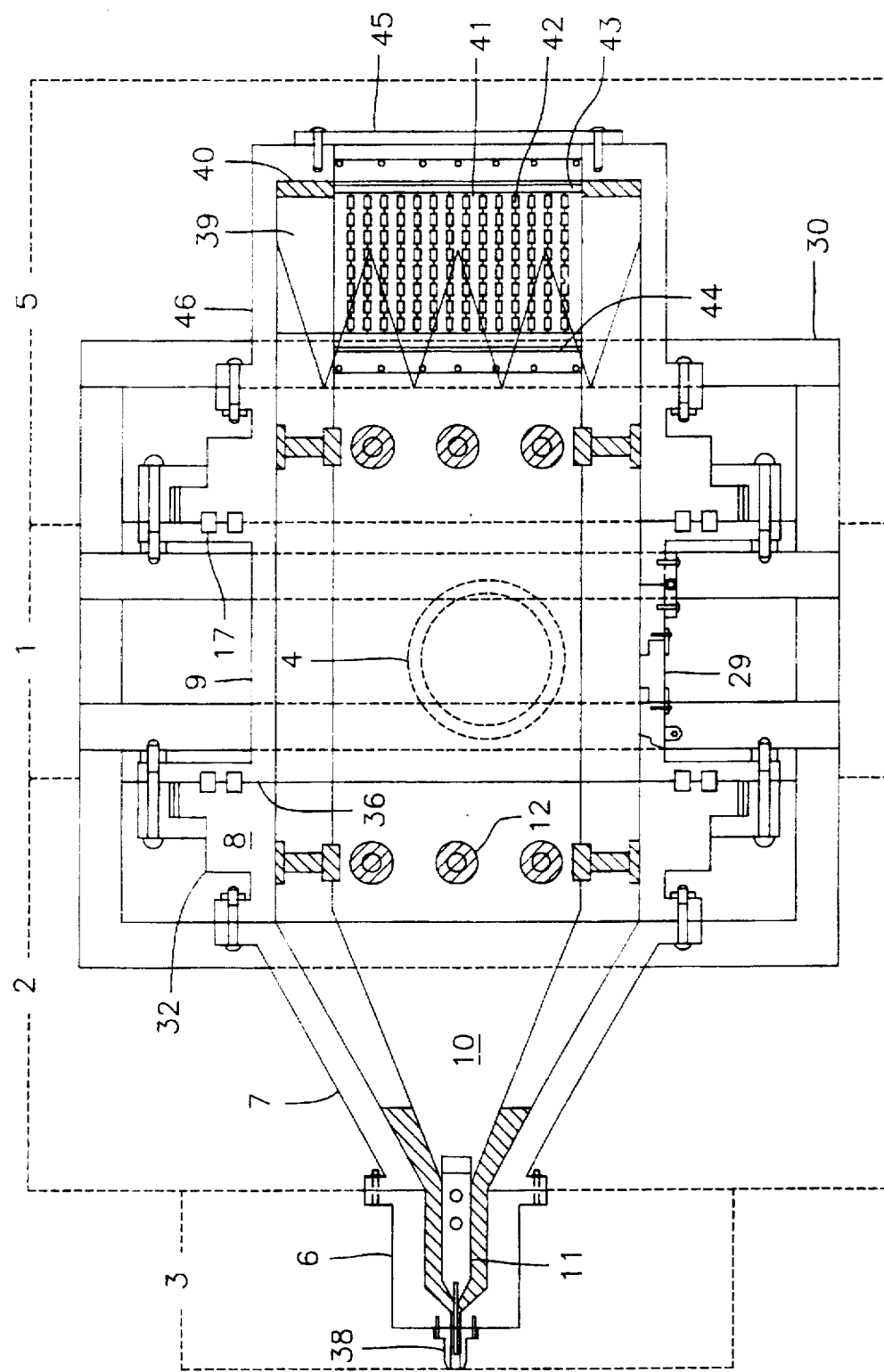
FIG. 2A is a plan view of ABEG of the present invention.

As shown in FIG. 2A, the first driving axis 32 of the taper area is coupled to internal conductor 10, first-fifth outer conductors 6, 7, 8 and 46, and is separable from fourth outer conductor 9 to be rotatable. This enables the variation of the lateral bearing.

Figure 2B:
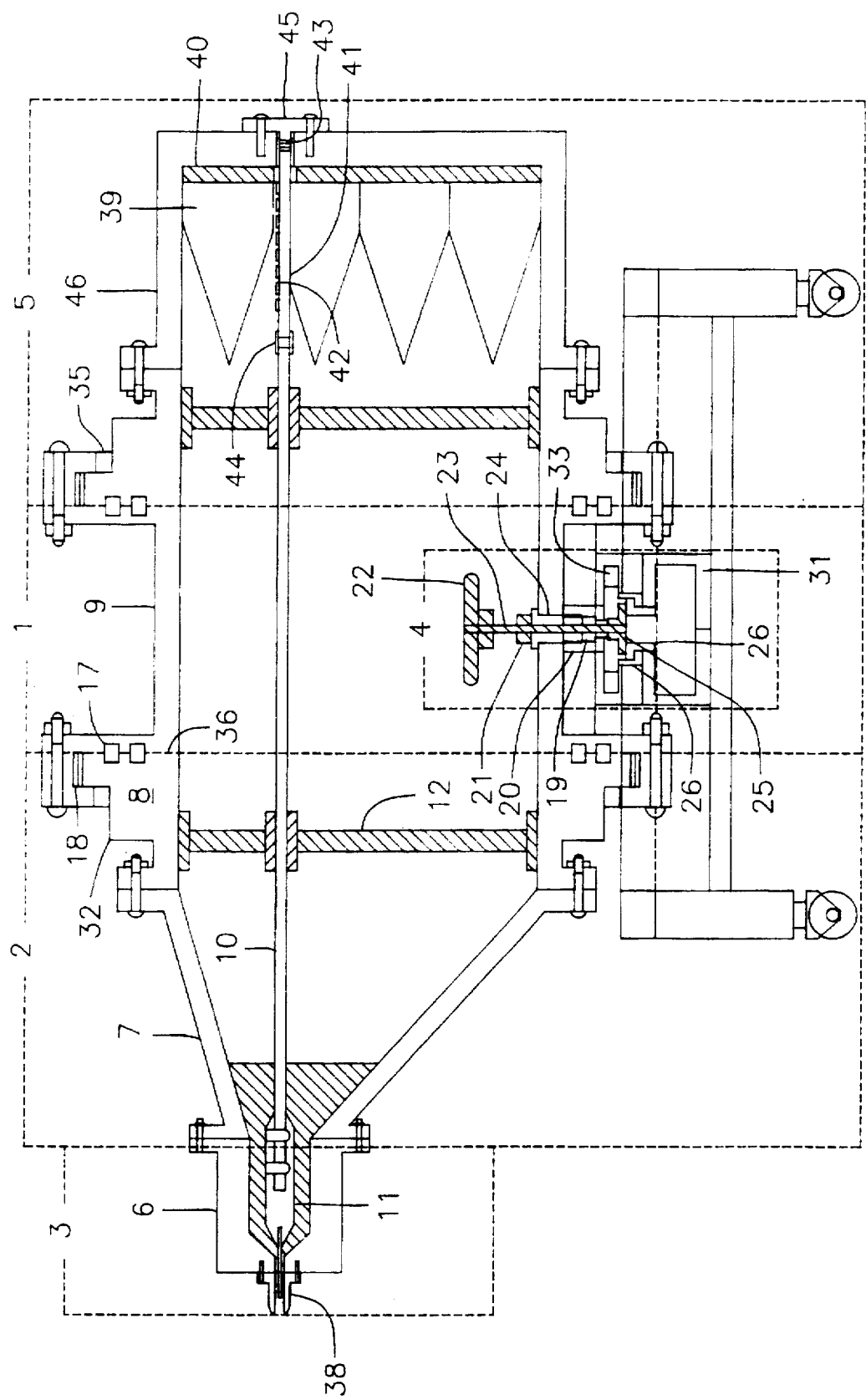
FIG. 2B is a front sectional view of ABEG of the present invention.

As shown in FIG. 2B, the second driving axis 33 is coupled to a rotary table installed in the ABEG cell. A shielding box 31 incorporating various power filters and signal filters is separable from fourth outer conductor 9, to thereby enable bearing variation to rotation.

First, a detailed structure of coaxial connector portion 3 and taper area 2 are to be explained with reference to FIGS. 2A, 2B and 3A and 3B. The ABEG cell for automatic measurement comprises an N-type connector 5, first outer conductor 6, second outer conductor 7, third outer conductor 8, first inner conductor 10, second inner conductor 11, first inner dielectric 12, second inner dielectric 13, third inner dielectric 14, fin 15, fixing ring 16, ring 17, and bearing 18.

In order to directly connect and rotate first driving axis 32 and first inner conductor 10, first inner dielectric 12 is inserted into third outer conductor 8 so that taper area 2, coaxial connector joint area 3 and N-type connector 5 are fixedly rotated together. A rotary table 4 is fixed to fourth outer conductor 9 to be separably rotated.

In order to prevent the inner conductors from being damaged due to overrotation, a stabilizer is installed. Specifically, a safety protrusion 34 is fixed to third outer conductor 8 and inserted into a safety recess 35 formed in fixing ring 16 so that the first driving axis moves as long as the movable length (angle) of the fixing ring.

Bearing 17 is installed to reduce the friction of gap 36. Another bearing of a different diameter is installed to increase the capacitance coupling between the gap and thereby prevent leakage of electromagnetic wave.

A ring 17 is installed to prevent leakage of electromagnetic wave by increasing the length of the gap and thus increasing the capacitance coupling. The ring may be replaced with a bearing.

For simplified manufacturing and assembly, a dielectric for supporting internal conductors 10 and 11 of the coaxial connector is divided into three parts. The first dielectric 12 supports first internal conductor 10 placed in the taper area. The third dielectric 13 is connectively inserted into N-type connector internal dielectric 37 so as to support second internal dielectric 11.

In to-be-tested object area 1, the center portion one third the distance between the internal conductors and outer conductors is regarded as a test space (IEC801-3), CISPR Pub (24)). In order to ensure a wider test space, the internal conductors are implemented as asymmetric rather than symmetric.

Rotary table 4 is installed to move toward door 28, as shown in FIG. 2A. This is because the internal conductors rotate only to the opposite side of the door to cancel the position variation of the center. A wider test space is secured by rotating only to one side rather than to both sides.

Figure 2C:
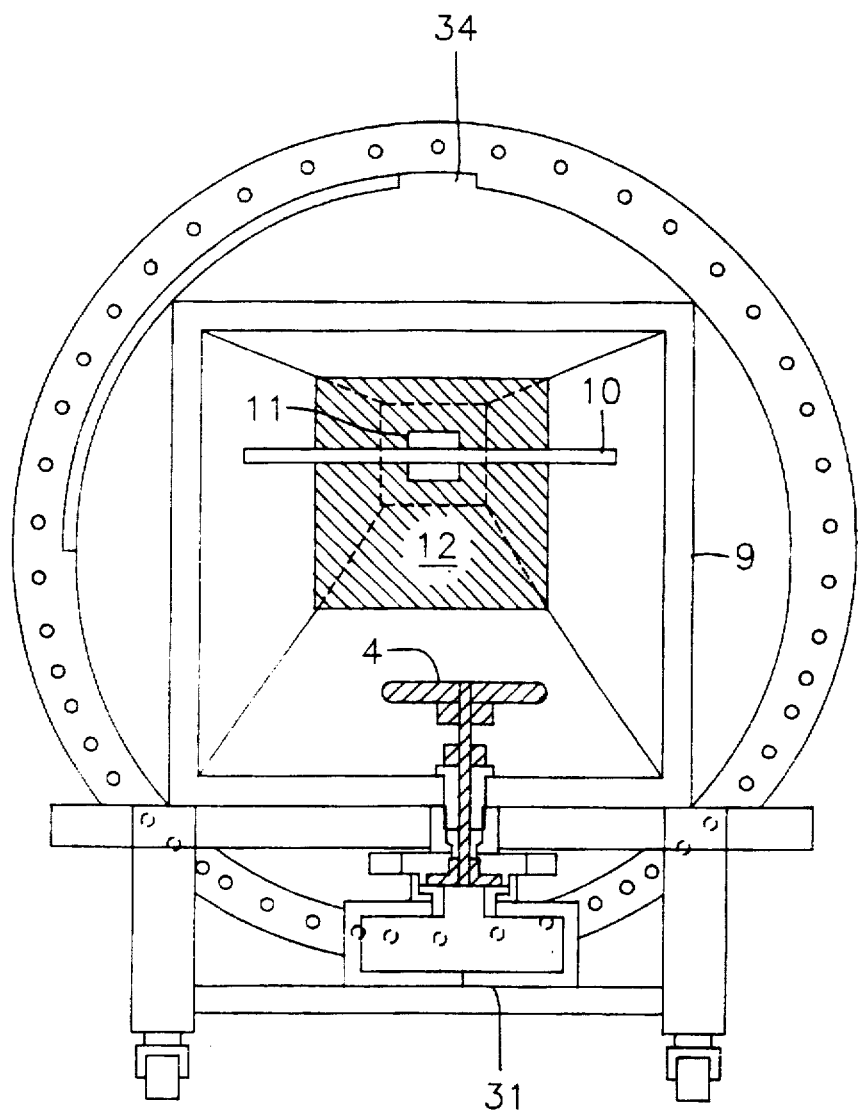
FIG. 2C is a right sectional view of ABEG of the present invention.
Figure 2D:
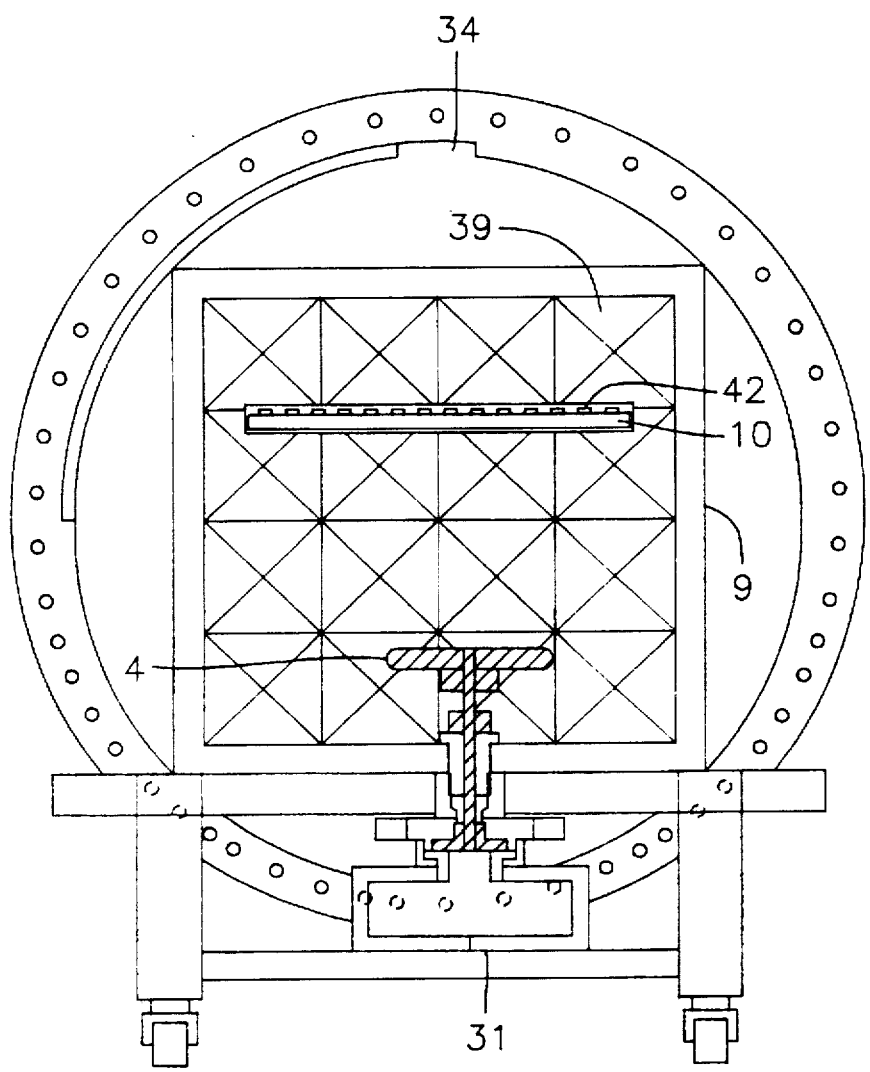
FIG. 2D is a left sectional view of ABEG of the present invention.
Figure 3A:
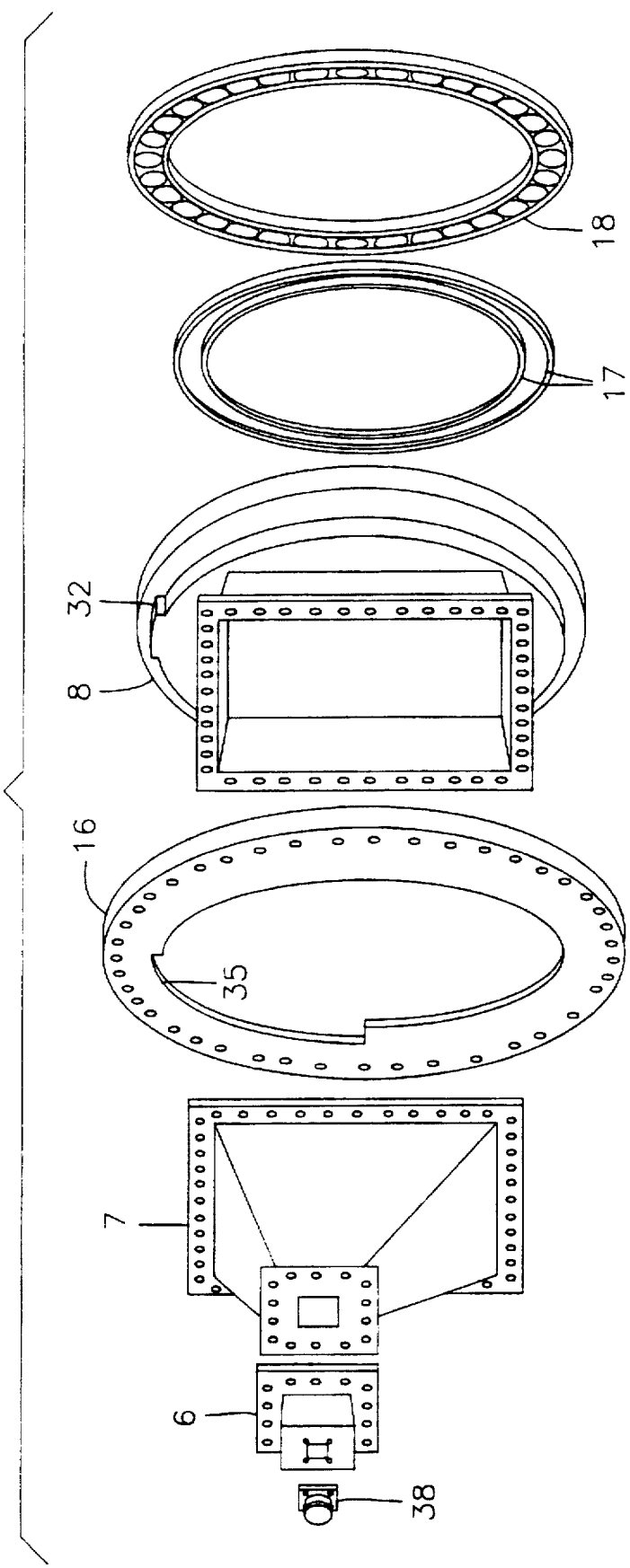
FIG. 3A is an outer exploded perspective view of the ABEG of the present invention.
Figure 3B:
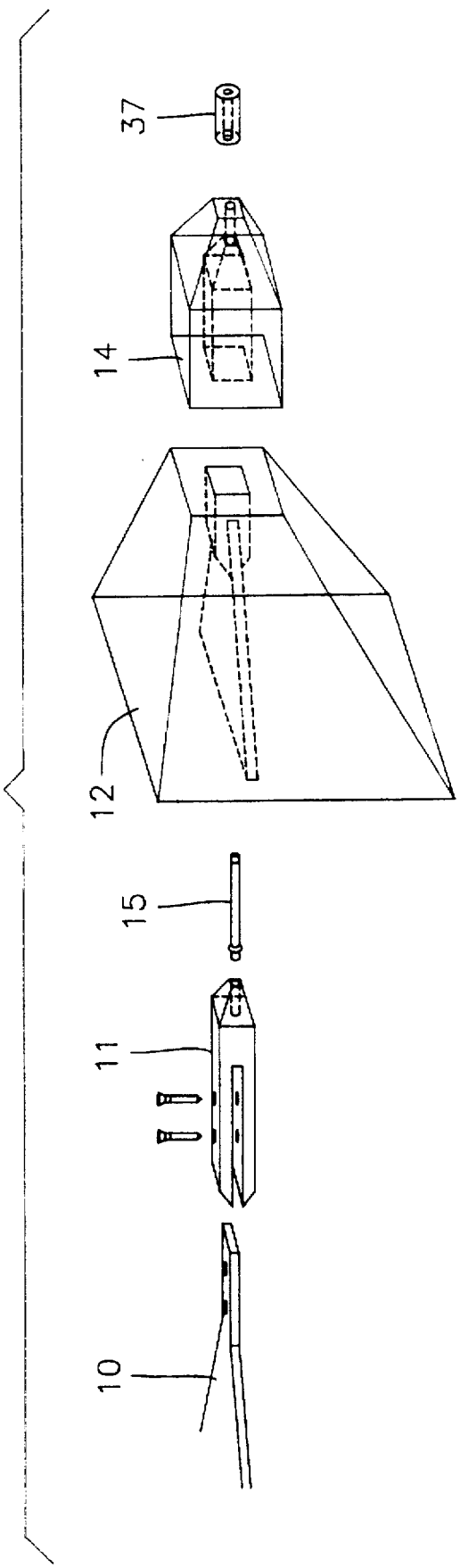
FIG. 3B is an internal exploded perspective view of the ABEG of the present invention.
Figure 4:
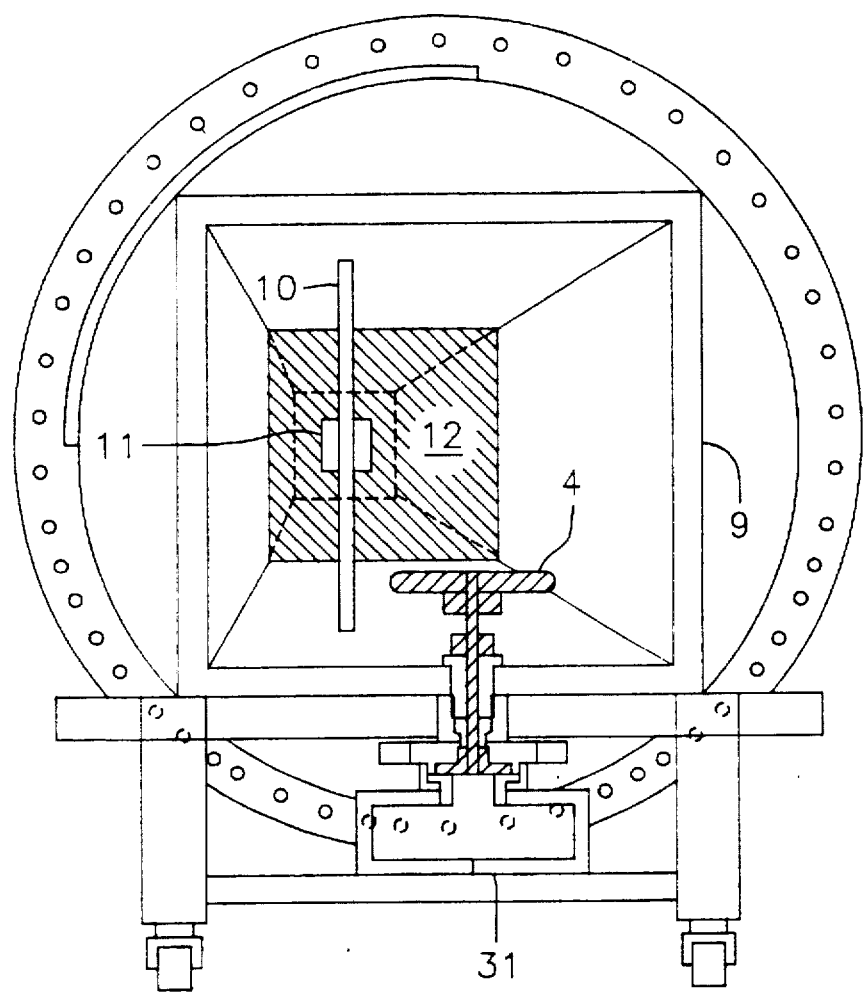
FIG. 4 is a right sectional view of the ABEG of the present invention whose first driving axis is rotated by 90°.

FIG. 2C is a right sectional view of the apparatus prior to the rotation of the internal conductors. FIG. 4 is a side sectional view thereof when the internal conductors are rotated by 90°.

In these drawings, the horizontal and vertical lengths of outer conductor 9 are the same in section. When a maximum circle coming into contact with the outer conductor is formed at the center thereof, it is noted that internal conductor 10 is placed within the circle.

The rotary table comprises a rotating stand 22 on which the object tested is placed, a rotating column 23 for rotating the rotating stand 23, first supporting numbers 21 for reducing physical damage at an intersection where the dielectric and metal meet due to the object's weight and rotation, second supporting numbers 25 for fixing second driving axis 33 and the rotating column, first male screw 19, first female screw 20, and second male screw 24 for allowing the second driving axis to rotate while supporting fourth outer conductor 9 in order to increase its durability, a shielding member 31 having power coupled to the object tested and filters of signal lines, and second female screw 26 and third male screw 27 for preventing shielding member 31 from being rotated when the second driving axis rotates.

In such a configuration, a hole is formed at the center of rotating column 23 through which the object's power and signal lines are inserted so that they are not tangled. Second guard 25, first male screw 19, rotating column 23, first guard 21, and rotating stand 22 are fixedly coupled to second driving axis 33, and second male screw 24 and first female screw 20 to the outer conductor so that the object tested is rotated by turning the second driving axis.

Shielding box 31 made of metal conductor such as iron, nickel, copper and aluminum is coupled to third male screw 27 not to be rotated when the second driving axis rotates. This does not cause the leakage of electromagnetic wave and the lines are not tangled.

For the rotating stand, rotating column and first guard, a dielectric such as Teflon which maintains nonconductivity and has a small relative permittivity is used to reduce the effect of the internal electromagnetic field.

The terminal portion 5 is constructed in which a distribution resistant plate 41 on which resistors are disposed on a PC board is coupled to internal conductor 10, and radio wave absorbent 39 and radio wave absorbing ferrite 40 are disposed in the terminal portion outer conductor 46. The distribution resistant plate absorbs DC to the electromagnetic wave of one hundred MHz. The radio wave absorbent absorbs electromagnetic wave above several hundred MHz. The radio wave absorbing ferrite acts to absorb electromagnetic wave of their intermediate band. This prevents the resonance mode from appearing.

If the resistors can interrupt a sufficiently high frequency band, the radio wave absorbing ferrite may not be installed. If the radio wave absorbent is sufficiently large to interrupt the low-band frequency, the radio wave absorbing ferrite may be eliminated.

In order to prevent internal conductor 10 from being bent in its driving, second outer conductor 7 or third and fifth outer conductors 8 and 46 may be coupled with a rod or stick-shaped solid material (iron, nickel, aluminum and the like) for the purpose of fixing their position.

In measuring electromagnetic wave tolerance (EMS) using the present invention, the first and second driving axes are simply moved by hand or electric motor. This increases the reproducibility of measurement and reduces measurement time. In addition, all the driving axes can be controlled externally to thereby automatize measurement.

In measuring electromagnetic interference (EMI) by the present invention, it is sufficient that the first and second driving axes are moved. Due to the inconsistency of the dipole axial component of the object tested and the polarization direction of the internal electromagnetic field, less bearing variation of the object tested enables measurement. Especially, this can measure the electromagnetic wave trouble and tolerance of a microwave oven which in an object tested whose bearing variation is hard.

Accordingly, the present invention facilitates the bearing variation of the object tested and reduces its physical deformation to thereby increase the accuracy and reproducibility in measurement. In addition, measurement time is reduced and the driving axes can be controlled externally, implementing automatized measurement.

What is claimed is:

1. An automatic broadband electromagnetic generator comprising:

a coaxial connector joint portion for maintaining impedance matching;

a taper area placed between an object tested and said coaxial connector joint portion, and in which a force transmitting member for rotating an internal conductor is installed to enable external driving;

a rotating table for performing bearing variation to the rotation of said object tested; and a terminal portion in which a radio wave absorber terminates high-band electromagnetic wave, a distribution resistor absorbs low-band electromagnetic wave, and a radio wave absorbing ferrite terminates their intermediate band.

2. An automatic broadband electromagnetic general (ABEG) as claimed in claim 1, wherein a first axial driving means is installed in said taper area to rotate the internal conductor, and a second axial driving means is installed in said rotating table outside the ABEG cell to enable measurement to be carried out by hand or a motor, to thereby prevent electromagnetic wave trouble.

3. An automatic broadband electromagnetic generator as claimed in claim 2, wherein the ABEG cell, at one end of which input/output is rapidly changed and at the other end of which a terminal portion is installed, a first axial driving means is installed to allow said internal conductor to externally rotate and to perform variation of the polarization for the electromagnetic field inside the ABEG, and a second axial driving means is installed to provide bearing variation for the rotation of the object tested.

4. An automatic broadband electromagnetic generator as claimed in claim 3, wherein a ring is inserted into a conductor on the outer structure of the ABEG in order to prevent the leakage of electromagnetic wave in rotation.

5. An automatic broadband electromagnetic generator as claimed in claim 1, wherein to interrupt external electromagnetic wave noise, said rotating table is provided with a shielding box having filters of power and signal inside to rotate with the said first and second axial driving means in measurement of electromagnetic wave trouble and tolerance, to thereby automatize measurement.

6. An automatic broadband electromagnetic generator as claimed in claim 1, wherein a axial driving means is installed in said taper area and terminal portion in order to rotate said internal conductor without its bending.

7. An automatic broadband electromagnetic generator as claimed in claim 1, wherein a support rod for the internal conductor is installed at a position spaced from where the tapering of said taper area ends for the purpose of supporting in internal conductor rotation.

8. An automatic broadband electromagnetic generator as claimed in claim 1, wherein a safety protrusion is installed in a conductor on the outer structure of the ABEG and a recess is formed in a fixing ring to allow said outer conductor to move as long as the movable length (angle) of said fixing ring in order to prevent said internal conductor from being damaged due to overrotation.

9. An automatic broadband electromagnetic generator as claimed in claim 1, wherein said rotating table comprises a filtering shielding box rotating with said rotating table for preventing the leakage of electromagnetic wave and power lines from being tangled in its rotation.

10. An automatic broadband electromagnetic generator as claimed in claim 1, wherein in order to prevent said internal conductor from being bent in its rotating outer conductors are coupled with a solid material means made of iron, nickel or aluminum, for the purpose of fixing their position.

* * * * *